(12) United States Patent  (10) Patent No.: US 8,575,646 B1
Shum  (45) Date of Patent: Nov. 5, 2013

(54) CREATING AN LED PACKAGE WITH OPTICAL ELEMENTS BY USING CONTROLLED WETTING

(75) Inventor: Frank Shum, Sunnyvale, CA (US)

(73) Assignee: Applied Lighting Solutions, LLC, Alameda, CA (US)

( * ) Notice: Subject to any disclaimer, the term of this patent is extended or adjusted under 35 U.S.C. 154(b) by 65 days.

(21) Appl. No.: 12/797,952

(22) Filed: Jun. 10, 2010

Related U.S. Application Data

(60) Provisional application No. 61/186,281, filed on Jun. 11, 2009.

(51) Int. Cl.
*H01L 31/0236* (2006.01)

(52) U.S. Cl.
USPC .................. 257/100; 257/667; 257/E33.059; 257/E31.117; 257/E23.116; 257/E23.123; 257/E23.125; 257/E23.126

(58) Field of Classification Search
None
See application file for complete search history.

(56) References Cited

U.S. PATENT DOCUMENTS

| | | | |
|---|---|---|---|
| 2002/0185965 A1* | 12/2002 | Collins et al. | 313/501 |
| 2003/0075723 A1* | 4/2003 | Heremans et al. | 257/98 |
| 2003/0134488 A1* | 7/2003 | Yamazaki et al. | 438/455 |
| 2004/0166320 A1* | 8/2004 | Kobusch | 428/404 |
| 2007/0013057 A1* | 1/2007 | Mazzochette | 257/723 |
| 2007/0029569 A1* | 2/2007 | Andrews | 257/99 |
| 2007/0065570 A1* | 3/2007 | Kugler et al. | 427/58 |
| 2008/0296607 A1* | 12/2008 | Nall et al. | 257/100 |

* cited by examiner

*Primary Examiner* — Fei Fei Yeung Lopez
(74) *Attorney, Agent, or Firm* — Aka Chan LLP

(57) ABSTRACT

A method of producing a LED package through controlled wetting.

20 Claims, 14 Drawing Sheets

CREATING AN LED PACKAGE WITH OPTICAL ELEMENTS BY USING CONTROLLED WETTING

CROSS-REFERENCE TO RELATED APPLICATIONS

This patent application claims the benefit of U.S. provisional patent application 61/186,281, filed Jun. 11, 2009, which is incorporated by reference along with all other cited references in this application.

BACKGROUND OF THE INVENTION

This invention relates to the field of lighting and illumination. More particularly, this invention is a technique to use the wetting phenomenon of liquids to encapsulate a light emitting diode (LED).

Since the development of the incandescent light bulb, electric lighting has become widely adopted and is considered one of the inventions which has had the most profound impact on human society. Lighting allows people to do many activities in the night hours which they would otherwise not be able to do without such lighting. Modern society depends on electric lighting.

LEDs have recently been growing in popularity for electric lighting because of it's overall lower energy consumption and it's longevity compared to other electric lighting. LEDs are used in a growing variety of applications.

Despite the increasing popularity of LEDs, there continues to be a need for improvements in LED technology. For example, LEDs are typically packaged so they can be used. Packaging is the process where an LED chip is provided with the necessary mechanics for electrical connection, mechanical stability, thermal dissipation, and environmental protection.

In a representative packaging process, the LED is encapsulated using an encapsulant material such as silicone to enclose and protect the LED chip and its associated components. The encapsulation can also useful to increase light extraction or suspend particles near the LED for various purposes. The encapsulant material can be shaped in a molding process to form optical elements to control the light distribution from the LED chip. However, the act of dispensing or injecting the silicone typically causes air bubbles inclusions resulting in rejects. The molding process uses a precision mold and time in the mold to cure the encapsulant, this decreases manufacturing throughput.

Therefore, there is a need for improved techniques of encapsulating LEDs.

BRIEF SUMMARY OF THE INVENTION

An improved technique forms a lens structure on a LED package without using direct molding or using a separately fabricated lens element. In an implementation, the wetting effect of a liquid such as silicone is controlled to achieve a desired form on a substrate surface that contains an LED chip. Wetting is the ability of a liquid to maintain contact with a solid surface due to intermolecular interactions between a solid and a liquid. The liquid is used both to encapsulate and to create the desired optical qualities for an LED package. Control of the liquid can be achieved by using special surface geometries or selective surface coatings. Additionally, the quantity of the liquid used will affect the final LED package.

Aspects of the invention is provide an improved process of encapsulating LEDs, without the need for precision molds, increase manufacturing throughput, reduce costs and increase yields.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
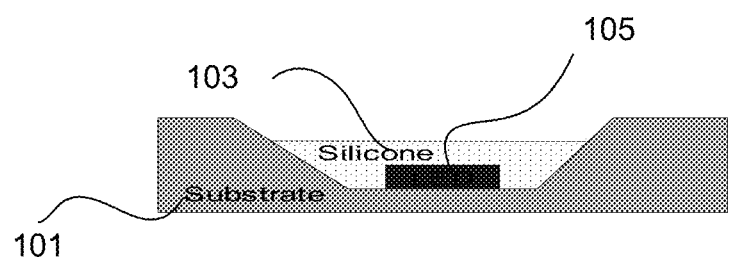
FIG. 1 shows two sample packaged LEDs encapsulated in silicone.

FIG. 1a shows an LED encapsulated in silicone. An LED chip 105 is placed within the cavity of a substrate 101. The substrate itself can be made of a variety of materials including silicon. Silicone 103 is dispensed into the cavity of the substrate 101 to encapsulate the LED chip 103. The silicone within the cavity is cured and the surface of the silicone forms into a planar top surface.

Figure 1B:
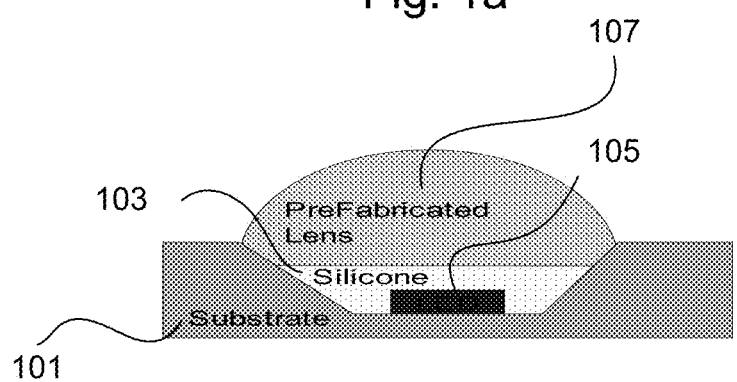

FIG. 1b shows another packaged LED. Similar to FIG. 1a, an LED chip is 105 placed within the cavity of a substrate 101 and encapsulated by silicone 103. An additional part, a prefabricated lens 107, is attached onto the planar top surface formed by the silicone 105. The lens is a separately fabricated structure and the space between the lens and LED is filled by the encapsulant. The addition of the prefabricated lens adds cost.

In another implementation, silicone is directly molded onto the LED package to form a desired shape. However, a shortcoming of this technique is that it uses a separate process to mold the silicone to affect the optical qualities of the LED package.

The techniques for making the above packages have drawbacks.

Figure 2:
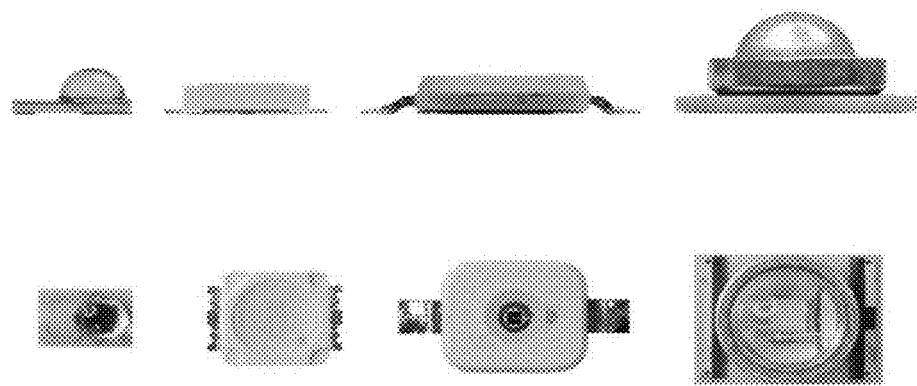
FIG. 2 shows four varieties of packaged LEDs in a side and top view.

FIG. 2 shows four different LED packages in two rows. The top row shows the side view of the LED package while the bottom row shows its respective top view.

Surface Wetting

Silicone can be used as an encapsulant for LEDs because of it low surface energy wets well to most materials used for LEDs packaging. The behavior of a liquid to wet a surface is particularly well documented as applied to water. In this patent, wet or wetting as well as hydrophilic and hydrophobic will be generalized to describe the behavior of any liquid, not just water.

Figure 3:
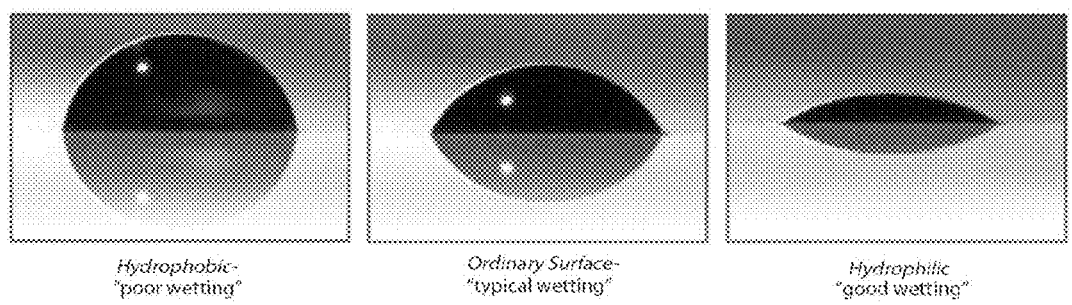
FIG. 3 shows an example of the effects of a hydrophobic and hydrophilic surface on a liquid.

FIG. 3 shows the different degrees of wetting as dependent on particular surface chemistries. For instance, in a hydrophobic surface, poor wetting occurs and the liquid makes less contact with the surface. In a hydrophilic surface, good wetting occurs and the liquid makes more contact with the surface. An ordinary surface exhibiting typical wetting is also shown for reference. Wikipedia, Hydrophobe, available at (http://en.wikipedia.org/wiki/Hydrophobe, last visited May 14, 2008), which is incorporated by reference along with all other references cited in this patent.

The ability to wet is important to promote adhesion of the liquid encapsulant material to the surface after curing. However, such hydrophilic surfaces do not promote beading of the encapsulant. Thus it is desirable to have a surface with different regions, some regions that more hydrophilic for adhesion and other regions that are more hydrophobic to promote lens formation. In some cases the raw substrate material may already have the necessary hydrophobic or hydrophilic properties. In other cases, coating or alternation of the surface geometry is necessary to achieve the desired property.

Figure 4:
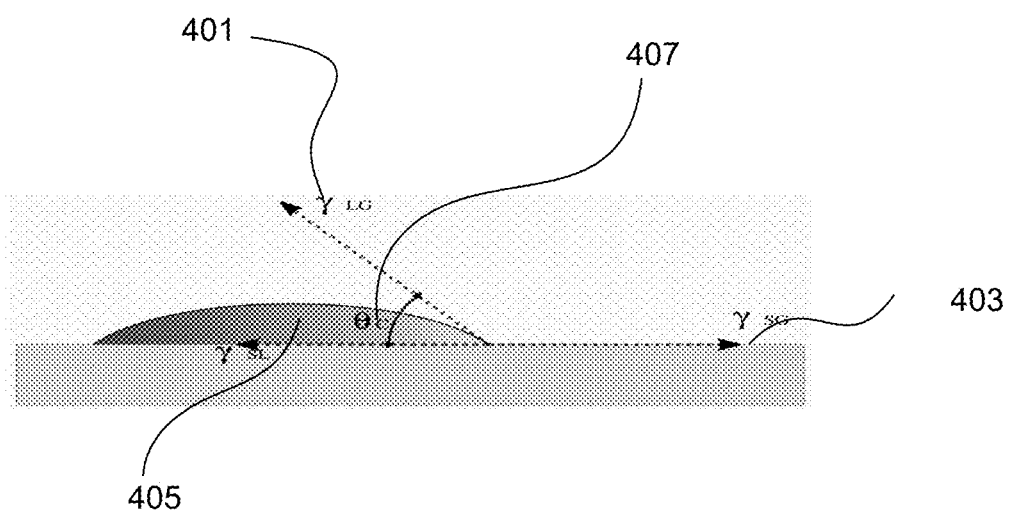
FIG. 4 shows the critical angle of a surface and liquid which measures the ability to wet.

FIG. 4 shows a figure of a surface and liquid that demonstrates a method of measuring the ability to wet. A contact angle ($\theta_c$) 407 is formed from the intersection of three phases: the gas 401, the solid 403, and the liquid 405. The higher the contact angle, the more difficult to wet or hydrophobic a particular surface while the lower the contact angle, the more easy to wet or hydrophilic a particular surface. Additionally, the contact angle and thus the lens curvature can be controlled by the quantity of liquid applied.

Figure 5:
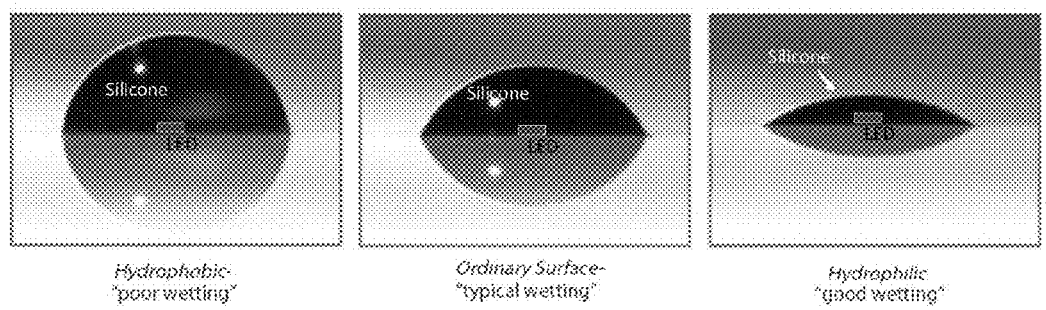
FIG. 5 shows a sample silicone lens encapsulating an LED.

FIG. 5 shows a sample silicone lens created by different surface chemistries with LED chips encapsulated within. The liquid silicone is dispensed on top of the LED, after the desired shape is achieved from the controlled wetting, the liquid is cured solidifying its shape. The process to solidify the lens shape is accomplished without significantly alternating the shape of the lens. For example, at higher temperatures the silicone surface tension properties may change resulting in alterations from the desired lens shape.

In this patent, the term "lens" refers to any type of optical element that can be formed by wetting and surface tension. This may include sections that are substantially of spheres or ellipsoids. Other shapes can also be created by changing the encapsulation contact area to the substrate. If the contact area is a circle, then the shape will be part of a hemisphere or ellipsoid. However, if the contact area is a polygon or an irregular shape, the result is a more complicated shape.

This patent discusses silicone as an example of an encapsulant material, but any material that is relatively transparent to LED light and has a liquid phase that later can be solidified may be used as an encapsulant. This includes epoxies, glues, or materials that in high temperature is a liquid and solidifies at a lower temperature such as acrylic, PMMA, or other thermoplastics.

The encapsulation may also have embedded materials for specific desired properties, for example, the encapsulation may be filled with scattering materials such as titanium dioxide ($TiO_2$), silicon oxide ($SiO_2$), air bubbles, or others; or filled with phosphor materials such as YAG, nitride based, silica based, or others; or filled with thixotropic materials such as fumed silica; or combinations of any of the above physically mixed together; combinations of any of the above as stratified layers.

Use of a Substrate Surface as a Method to Affect Wetting Properties

In an embodiment of the invention, selection of a substrate material is used to control the liquid. The measure of wetting is documented for many specific materials.

Use of Coating as a Method to Affect Wetting Properties

Coatings as thin as a few nanometers (e.g., 1 or less, 2 or less, 3 or less, 4 or less, or 5 or less nanometers) or thin as a few microns (e.g. less than 1, less than 2, less than 3, less than 4, less than 5) can be used to dramatically change the wetting properties of a surface. The details of how the contact angle is related to a given material is documented. Very generally, the contact angle is related to the critical surface tension of a material surface. A comparison of materials and its respective critical surface tension is shown in table 1.

TABLE 1

Critical Surface Tension in Dynes/cm

|  | $\gamma_c$ |
|---|---|
| heptadecafluorodecyltrichlorosilane | 12.0 |
| polytetrafluoroethylene | 18.5 |
| octadecyltrichlorosilane | 20-24 |
| methyltrimethoxysilane | 22.5 |
| nonafluorohexyltrimethoxysilane | 23.0 |
| vinyltriethoxysilane | 25 |
| paraffin wax | 25.5 |
| ethyltrimethoxysilane | 27.0 |
| propyltrimethoxysilane | 28.5 |
| glass, soda-lime (wet) | 30.0 |
| poly(chlorotrifluoroethylene) | 31.0 |
| poly(propylene) | 31.0 |
| poly(propylene oxide) | 32 |
| polyethylene | 33.0 |
| trifluoropropyltrimethoxysilane | 33.5 |
| 3-(2-aminoethyl)-aminopropyl-trimethoxysilane | 33.5 |
| poly(styrene) | 34 |
| p-tolyltrimethoxysilane | 34 |
| cyanoethyltrimethoxysilane | 34 |
| aminopropyltriethoxysilane | 35 |
| polymethylmethacrylate | 39 |
| polyvinylchloride | 39 |
| phenyltrimethoxysilane | 40.0 |
| chloropropyltrimethoxysilane | 40.5 |
| mercaptopropyltrimethoxysilane | 41 |
| glycidoxypropyltrimethoxysilane | 42.5 |
| polyethyleneterephthalate | 43 |
| poly(ethylene oxide) | 43-45 |
| copper (dry) | 44 |
| aluminum (dry) | 45 |
| iron (dry) | 46 |
| nylon 6/6 | 45-6 |
| glass, soda-lime (dry) | 47 |
| silica, fused | 78 |
| titanium dioxide (anatase) | 91 |
| ferric oxide | 107 |
| tin oxide | 111 |

Note:
Critical surface tensions for silanes refer to smooth treated surfaces.

Figure 6:
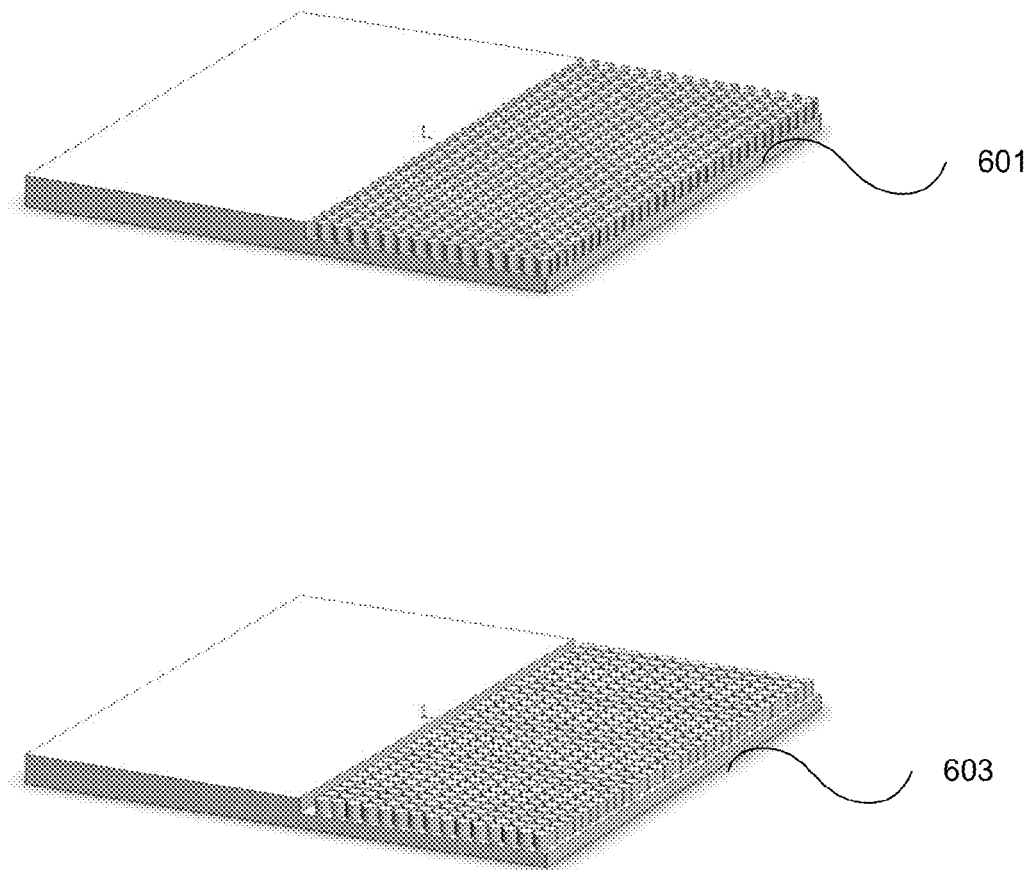
FIG. 6 shows two substrates with pin and hole etching.

Table 1 source is from Painting & Coatings Industry Magazine, *Hydrophobicity, Hydrophilicity and Silanes* FIG. 6 (October 2006).

The lower the critical surface tension, the lower the ability to wet that surface resulting in higher contact angles. For example, polytetrafluoroethylene (commonly known as Teflon®, which is a trademark of E. I. du Pont de Nemours and Company or its affiliates) has a very low critical surface tension providing its nonstick properties. Thus water will "bead" up on Teflon.

In an embodiment of the invention, the wetting properties of the substrate are changed with a coating of material such as but not limited to Teflon, Nusil's Lightspan Product LS (1,2, 5,10)-2233, or other materials listed in table 1.

There are some processes for selective coating of surfaces. In one sample process, a thin film with certain hydrophobic or hydrophilic properties is deposited. This deposition can be achieved using commercially available equipment such as from Applied Microstructures, Inc. The film is selected from a class of material that is sensitive to ultraviolet light. After coating, certain areas are exposed to ultraviolet light in an oxygen plasma cleaner or etcher. In the ultraviolet exposed areas, the film is either removed or deactivated. Thus, only in the selected masked areas or not exposed to ultraviolet light, will the film property remain. In another process, the area that does not require the coating is masked off, and the coating is applied and the exposed areas is coated.

Figure 8:
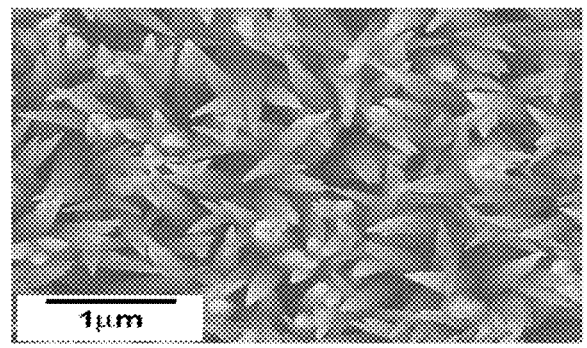
FIG. 8 shows a scanning electron microscope image of a super hydrophobic surface and its effects on a water droplet on its surface.
Figure 8:

In an embodiment of the invention, superhydrophobic surfaces with very high contact angles, can be accomplished by altering the surface structure at the micron to submicron level. FIG. 8 shows a scanning electron microscope image of a film of brucite-type cobalt hydroxide film with a super hydrophobic property and its effects on a water droplet on its surface. Eiji Hosono, et al., "Superhydrophobic Perpendicular Nanopin Film by the Bottom-Up Process," J. Am. Chem. Soc. 13458-13459 (2005). By the selective application of such nano pin films, specific wetting properties can be achieved for the desired encapsulation shape.

Use of Etching as a Method to Affect Wetting Properties

The surface of the substrate can also be etched to achieve hydrophobic properties by creating many edge or point contacts to the liquid. For example, the surface can be roughened, meshed, honey combed, or etched to pins or holes geometries. The density and size of the etchings provides a mean to control the degree of wetting and thus the encapsulation shape. In another embodiment of the invention, the etched structures are further coated with a material such as those previous described to enhance its wetting properties.

FIG. 6 shows two sample representations of a hydrophobic surface. The top sample 601 shows half of a substrate surface etched into holes. The bottom sample 603 shows half of a substrate surface etched into pins.

Figure 7:
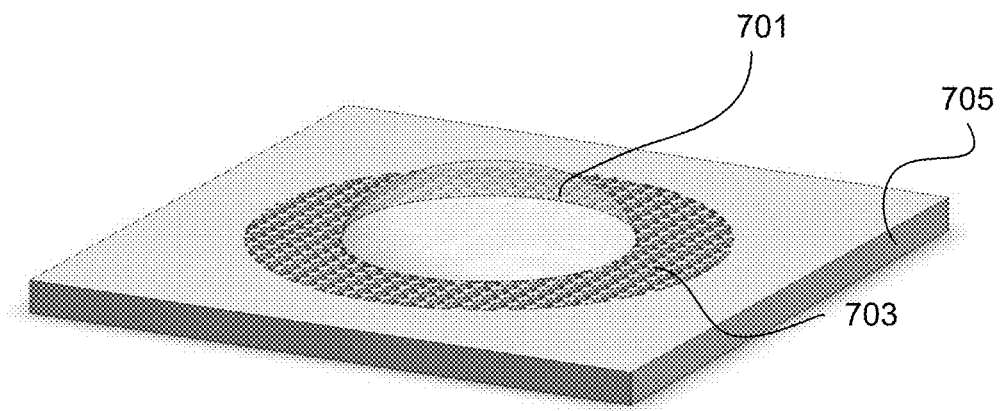
FIG. 7 shows the effect of the density of etching on the substrate surface on the wetting of a liquid.
Figure 7:
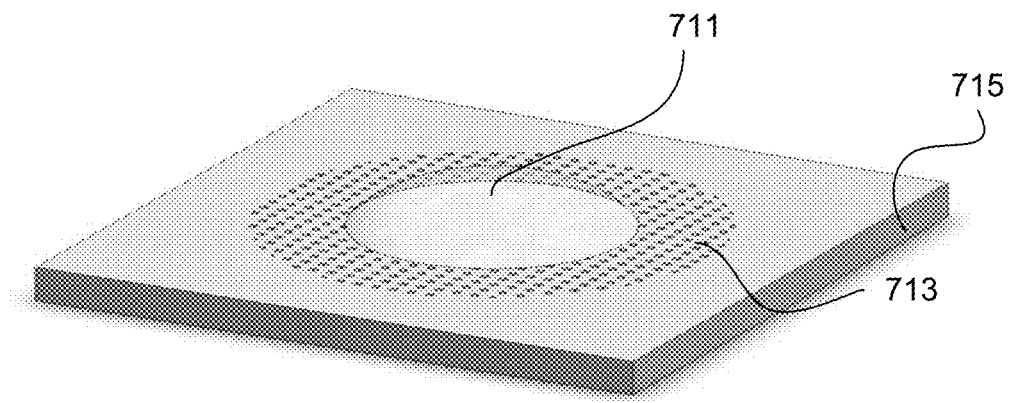

FIG. 7 shows two sample representations of the density of etchings to affect the wetting abilities of a substrate. The first substrate surface 705 has been densely etched in a ring pattern 703 and a liquid 701 is applied on the substrate surface. The liquid shows a high contact angle due to wetting on the hydrophobic surface etching. The second substrate surface 715 has been sparsely etched in a ring pattern 713 and a liquid 711 is applied on the substrate surface. The liquid shows a lower contact angle due to wetting on the hydrophilic surface etching. Although the etching of holes and pins patterns have been described, other etching geometries are possible including trenches, ridges, etc. The holes and pins need not be circular in cross section, they can be triangular, square, or other polygon shapes.

Use of Substrate Geometries to Affect Wetting Properties

Figure 9:
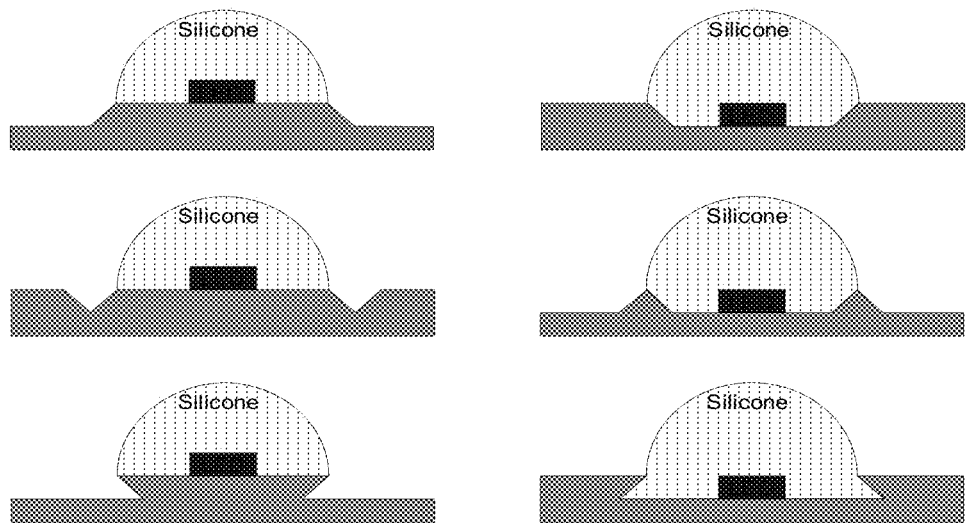
FIG. 9 shows sample embodiments of the invention on non planar structures.

In another embodiment, nonplanar surfaces, for example, a pedestal or a cup-like structure, provide edges to encourage the "beading" behavior of liquids. FIG. 9 shows sample embodiments of the invention on nonplanar structures. Such nonplanar surfaces creates edges that affect the lens shape and may on their own may be sufficient without the need for further surface coatings or modifications.

Figure 10:
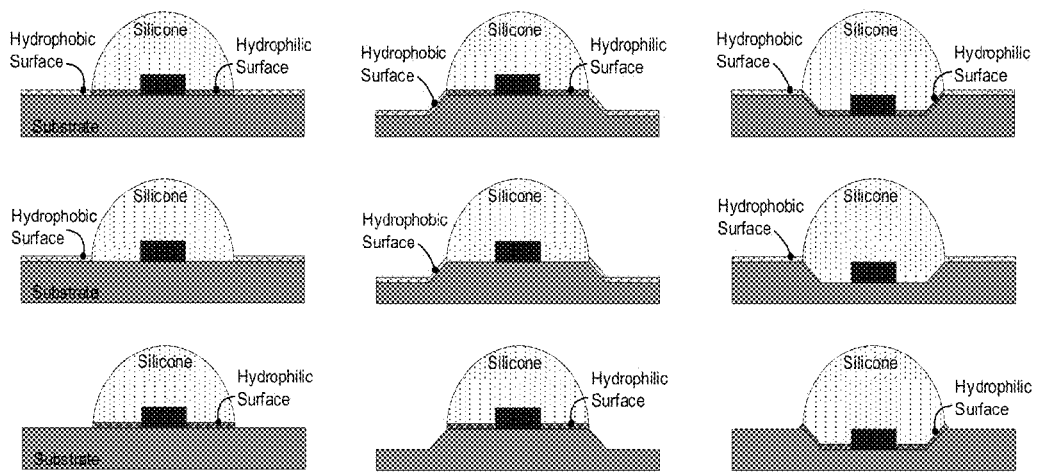
FIG. 10 shows hydrophilic or hydrophobic surfaces, or both, on sample compatible nonplanar surfaces.

In an embodiment of the invention, selective area coating with hydrophobic or hydrophilic materials, or both, is used in conjunction with both planar and nonplanar substrate surfaces. FIG. 10 shows hydrophilic or hydrophobic coated surfaces on both planar and nonplanar surfaces. Although the samples of FIG. 10 show only geometries of approximately forty-five degree angles, other geometries and angles are compatible and may be used.

For the purposes this patent, hydrophilic surface refers to a surface that has been treated to make it more hydrophobic than the native planar smooth substrate. The surface modification may include coating, etching, or other modification. Although in FIG. 10, the hydrophobic surface is shown only on the substrate, the hydrophilic surface can also cover all or a portion of the LED. The hydrophilic surface can also run under portions or all of the LED. In some cases, the native bare substrate may be hydrophilic enough, so treatment is not necessary.

Hydrophobic surfaces can also include the superhydrophobic surface structures described earlier. These superhydrophobic surfaces can further be enhanced with further coatings. In some cases, the native bare substrate may be hydrophobic enough, so treatment is not necessary.

Sample Method of Implementation

Precision dispensing of the liquid silicone can be done individually with each LED package. In another implementation, a batch process of multiple LED packages relying on silicone wetting in the hydrophilic or hydrophobic surface areas with the excess silicone running off the substrate is possible.

Figure 11:
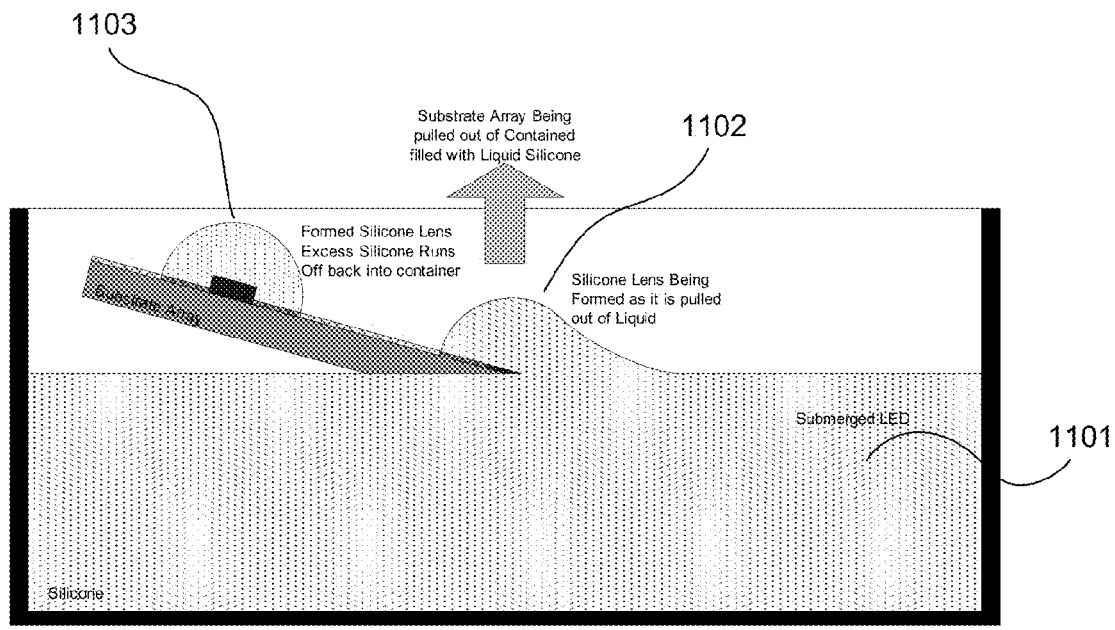
FIG. 11 shows a method of implementing the invention.

FIG. 11 shows a method for implementing the invention. One or more LEDs on a common substrate are dipped into a container of liquid silicone. As the substrate is pulled out of the container, the excess silicone runs off leaving certain designated areas where the silicone wets and forms the desired lens.

For instance, the entire array of LEDs are first submerged in the silicone 1101. As the LED is pulled out of the silicone liquid 1101, the wetting properties of the substrate surface begin to forms a desired shape 1102. Once the LED is completely removed from the silicone, excess silicone runs off the LED while maintaining the desired shape 1103. The entire substrate with liquid silicone lens is cured and divided to form individual substrates around each LED chips and optic.

Instead of dipping, other processes variations are possible, such as spraying or pouring the liquid silicone on the substrate and allowing the excess to run off.

Multiple Layers of Encapsulants

In an embodiment of the invention, multiple layers of encapsulation are formed by successive dispensing and curing of the encapsulant material. In one embodiment, the first encapsulation layer is filled with phosphor while the other layer is left clear and unfilled.

Figure 12:
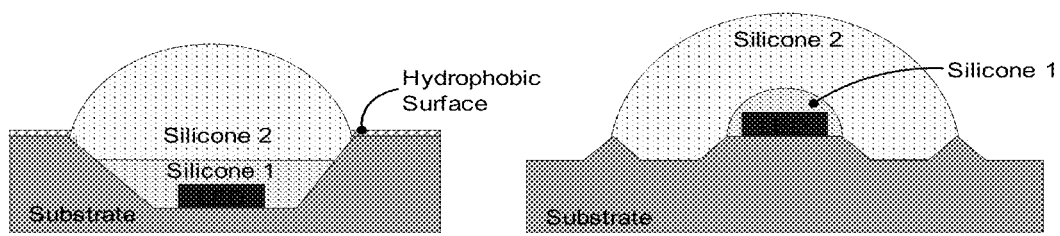
FIG. 12 shows two examples of where a LED chip and substrate is put through two wetting procedures to form two separate silicone layers.

FIG. 12 shows two examples of where a LED chip and substrate is put through two wetting procedures to form two separate silicone layers.

Figure 13:
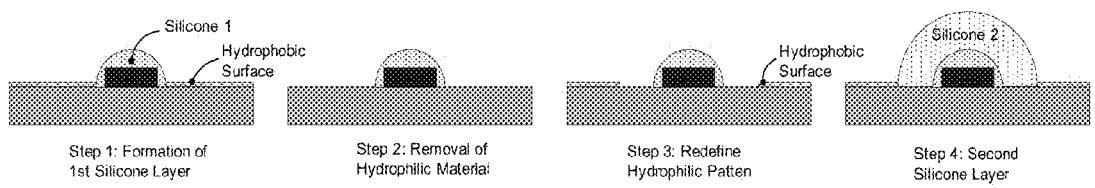
FIG. 13 shows a method for implementing the invention for two layers.

FIG. 13 shows a method for implementing the invention for two layers. In step 1, a hydrophobic coating with a specific pattern is used control the wetting of the first encapsulation layer. This first encapsulation layer is then cured. In step 2, the hydrophobic material is removed. In step 3, a second hydrophobic coating with another pattern is applied. In step 4, a second layer of liquid encapsulation is applied and it wetting properties are controlled by the second hydrophobic coating. This second encapsulation layer is then cured.

Figure 14:
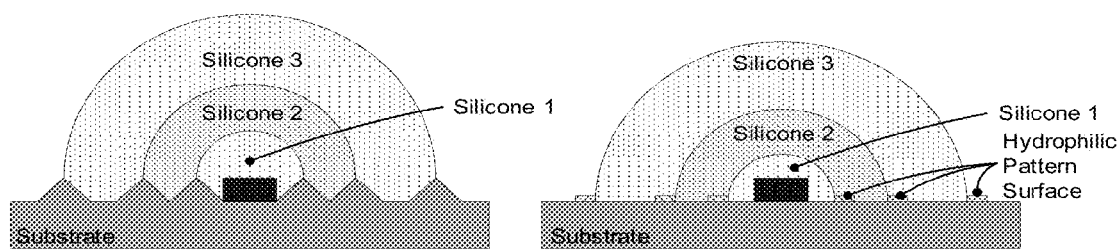
FIG. 14 shows two examples of where a LED chip and substrate is put through three wetting procedures to form three separate Silicone layers.

FIG. 14 shows two examples of where a LED chip and substrate is put through three wetting procedures to form three separate silicone layers. An example of a useful three-layer structure is to have the middle silicone layer filled with phosphor while leaving the other two layers clear.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. An LED device comprising:
    a LED chip;
    at least one optically transmissive material encapsulating the LED chip;
    a substrate surface comprises a patterned coating comprising a plurality of pins;
    at least one hydrophilic region on the substrate;
    at least one enhanced hydrophobic region on the substrate, wherein the hydrophobic region is planar with the hydrophilic region, and
    the at least one enhanced hydrophobic region is formed by coating with a hydrophobic or super hydrophobic material, wherein the hydrophilic region is selected from at least from of the following material or their derivates: nanopin film, polytetrafluoroethylene, Lightspan Product LS (1,2,5,10)-2233, heptadecafluorodecyltrimethoxysilane, poly(tetrafluoroethylene), poly(propylene), octadecyldimethylchlorosilane, octadecyltrichlorosilane, tris(trimethylsiloxy)silylethyldimethylchlorosilane, octyldimethylchlorosilane, dimethyldichlorosilane, butyldimethylchlorosilane, trimethylchlorosilane, poly(ethylene), poly(styrene), poly(chlorotrifluoroethylene), heptadecafluorodecyltrichlorosilane, polytetrafluoroethylene, octadecyltrichlorosilane, methyltrimethoxysilane, nonafluorohexyltrimethoxysilane, vinyltriethoxysilane, paraffin wax, ethyltrimethoxysilane, propyltrimethoxysilane, soda lime glass, borosilicate glass, poly(chlorotrifluoroethylene), poly(propylene oxide), polyethylene, trifluoropropyltrimethoxysilane 3-(2-aminoethyl)-aminopropyltrimethoxysilane, p-tolyltrimethoxysilane, cyanoethyltrimethoxysilane, aminopropyltriethoxysilane, polymethylmethacrylate, polyvinylchloride, phenyltrimethoxysilane, chloropropyltrimethoxysilane, or mercaptopropyltrimethoxysilane.

2. The at least one enhanced hydrophobic region of claim 1 is formed by mechanically altering the geometry of the substrate.

3. The mechanical geometries of claim 2 are mechanically formed are edges.

4. The mechanical geometries of claim 2 are formed by mechanically alternating the substrate to form regions of holes or pins.

5. The LED device of claim 1 also comprising a phosphor layer.

6. The hydrophobic region of claim 1 is removed after the silicone is cured.

7. An LED device comprising:
    a LED chip;
    at least one silicone material encapsulating the LED chip to form a lens;
    a substrate surface comprises a patterned coating comprising a plurality of pins;
    at least one enhanced hydrophobic region on the substrate; and
    a phosphor layer within the encapsulant material, wherein the at least one enhanced hydrophobic region is planar with the phosphor layer, and
    at least one hydrophilic region is selected from at least from of the following material or their derivates: nanopin film, polytetrafluoroethylene, Lightspan Product LS (1,2,5,10)-2233, heptadecafluorodecyltrimethoxysilane, poly(tetrafluoroethylene), poly(propylene), octadecyldimethylchlorosilane, octadecyltrichlorosilane, tris(trimethylsiloxy)silylethyldimethylchlorosilane, octyldimethylchlorosilane, dimethyldichlorosilane, butyldimethylchlorosilane, trimethylchlorosilane, poly(ethylene), poly(styrene), poly(chlorotrifluoroethylene), heptadecafluorodecyltrichlorosilane, polytetrafluoroethylene, octadecyltrichlorosilane, methyltrimethoxysilane, nonafluorohexyltrimethoxysilane, vinyltriethoxysilane, paraffin wax, ethyltrimethoxysilane, propyltrimethoxysilane, soda lime glass, borosilicate glass, poly(chlorotrifluoroethylene), poly(propylene oxide), polyethylene, trifluoropropyltrimethoxysilane 3-(2-aminoethyl)-aminopropyltrimethoxysilane, p-tolyltrimethoxysilane, cyanoethyltrimethoxysilane, aminopropyltriethoxysilane, polymethylmethacrylate, polyvinylchloride, phenyltrimethoxysilane, chloropropyltrimethoxysilane, mercaptopropyltrimethoxysilane.

8. The phosphor layer of claim 7 is a conformal coating directly applied to the LED chip less than 200 microns thick.

9. The phosphor layer of claim 7 is dispersed in at least one silicone material.

10. The hydrophobic region of claim 7 is removed after the silicone is cured.

11. The substrate of claim 7 also has at least one region where it has enhanced hydrophilic properties.

12. An LED device comprising:
    a LED chip;
    at least one silicone material encapsulating the LED chip to form a lens;
    a substrate surface;
    at least one enhanced hydrophobic region on the substrate; and
    a phosphor layer within the encapsulant material, wherein the at least one enhanced hydrophobic region is planar with the phosphor layer, and the substrate surface comprises a patterned coating comprising a plurality of pins.

13. The phosphor layer of claim 12 is a conformal coating directly applied to the LED chip less than 200 microns thick.

14. The phosphor layer of claim 12 is dispersed in at least one silicone material.

15. The hydrophobic region of claim 12 is removed after the silicone is cured.

16. The substrate of claim 12 also has at least one region where it has enhanced hydrophilic properties.

17. The hydrophilic region of claim 16 is selected from at least from of the following material or their derivates: nanopin film, polytetrafluoroethylene, Lightspan Product LS (1,2,5,10)-2233, heptadecafluorodecyltrimethoxysilane, poly(tetrafluoroethylene), poly(propylene), octadecyldimethylchlorosilane, octadecyltrichlorosilane, tris(trimethylsiloxy)silylethyldimethylchlorosilane, octyldimethylchlorosilane, dimethyldichlorosilane, butyldimethylchlorosilane, trimethylchlorosilane, poly(ethylene), poly(styrene), poly(chlorotrifluoroethylene), heptadecafluorodecyltrichlorosilane, polytetrafluoroethylene, octadecyltrichlorosilane, methyltrimethoxysilane, nonafluorohexyltrimethoxysilane, vinyltriethoxysilane, paraffin wax, ethyltrimethoxysilane, propyltrimethoxysilane, soda lime glass, borosilicate glass, poly(chlorotrifluoroethylene), poly(propylene oxide), polyethylene, trifluoropropyltrimethoxysilane 3-(2-aminoethyl)-aminopropyltrimethoxysilane, p-tolyltrimethoxysilane, cyanoethyltrimethoxysilane, aminopropyltriethoxysilane, polymethylmethacrylate, polyvinylchloride, phenyltrimethoxysilane, chloropropyltrimethoxysilane, mercaptopropyltrimethoxysilane.

18. The optically transmissive material of claim 1 is a silicone or an epoxy material.

19. The substrate of claim 1 also has at least one region where it has enhanced hydrophilic properties.

20. The at least one enhanced hydrophobic region of claim 1 is formed by coating with a hydrophobic or super hydrophobic material.

* * * * *